United States Patent

Frederick et al.

[11] Patent Number: 6,104,943
[45] Date of Patent: Aug. 15, 2000

[54] PHASED ARRAY ECHOPLANAR IMAGING SYSTEM FOR FMRI

[75] Inventors: Blaise deB. Frederick, Lexington; Lawrence Wald, Cambridge; Perry F. Renshaw, Arlington, all of Mass.

[73] Assignee: The McLean Hospital Corporation, Belmont, Mass.

[21] Appl. No.: 08/970,214

[22] Filed: Nov. 14, 1997

[51] Int. Cl.[7] .................................................. A61B 5/055
[52] U.S. Cl. ........................ 600/410; 600/421; 324/309; 324/318
[58] Field of Search ..................... 600/410, 421, 600/422, 419; 324/309, 318, 322, 307

[56] References Cited

U.S. PATENT DOCUMENTS

| | | | |
|---|---|---|---|
| 5,528,155 | 6/1996 | King et al. | 324/713 |
| 5,572,130 | 11/1996 | Ratzel | 324/318 |
| 5,653,233 | 8/1997 | Pelc et al. | 600/410 |

OTHER PUBLICATIONS

Bandettini, et al. "Processing strategies for time–course data sets in functional MRI of the human brain" *Magnetic Resonance in Medicine* 20:161–73 (1993).
Belliveau, et al. "Functional cerebral imaging by susceptibility–contrast NMR" *Magnetic Resonance in Medicine* 14:538–546 (1990).
Hayes, et al. "Volume imaging with MR phased arrays" *Magn Reson Med* 18:309–19 (1991).
Hayes, et al. "Temporal lobes: surface MR coil phased–array imaging" *Radiology* 189:918–20 (1993).
Harris, et al., "Dynamic Susceptibility Contrast MRI of Regional Cerebral Blood Volume in Alzheimer's Disease" *American Journal of Psychiatry* 153:721–4 (1996).
Kwong, et al., "Dynamic magnetic resonance imaging of human brain activity during primary sensory stimulation" *Proc Natl Acad Sci USA* 89:5675–9 (1992).
Maas, et al., "Decoupled automated rotational and translational registration for functional MRI time series data: the DART registration algorithm" *Magnetic Resonance in Medicine* 37:131–139 (1997).
Ogawa, et al., "Intrinsic signal changes accompanying sensory stimulation: functional brain mapping with magnetic resonances imaging" *Proc Natl Acad Sci USA* 89:5675–9 (1990).
Roemer, et al., "The NMR phased array" *Magn Reson Med* 16:192–225 (1990).
Rosen, et al., "Perfusion imaging by nuclear magnetic resonance" *Magn Reson Q* 5:263–81 (1989).
Turner, et al., "Functional mapping of the human visual cortex at 4 and 1.5 tesla using deoxygenation contrast EPI" *Magn Reson Med* 29:277–9 (1993).
Vrillinger, et al., "Dynamic imaging with lanthanide chelates in normal brain: contrast due to magnetic susceptibility effects" *Magn Reson Med* 6:164–74 (1988).
Wald, et al., "Proton spectroscopic imaging of the human brain using phased array detectors" *Magnetic Resonance in Medicine* 34:440–5 (1995).
Wald et al., "Phased array detectors and an automated intensity correction algorithm for high resolution imaging of the human brain" *Magnetic Resonance in Medicine* 34:433–9 (1995).
Wu, et al., "Time Domain Multiplexing Phased Array in EPI" In *Fifth Scientific Meeting and Exhibition of the International Society for Magnetic Resonance in Medicine*, Vancouver, (1997).
Noll et al, Theory, Simulation, and Compensation of Physiological Motion Artifacts in Functional MRI, IEEE, pp 40–44, 1994.

*Primary Examiner*—Ruth S. Smith
*Attorney, Agent, or Firm*—Clark & Elbing, LLP

[57] ABSTRACT

The design and construction of a novel phased array echoplanar receiver system for magnetic resonance imaging for use with a standard clinical EPI system is described, and in vivo results showing increased SNR are presented.

2 Claims, 6 Drawing Sheets

PHASED ARRAY ECHOPLANAR IMAGING SYSTEM FOR FMRI

BACKGROUND OF THE INVENTION

Functional magnetic resonance imaging (fMRI) has become one of the most important new imaging tools in clinical neuroscience, due to its ability non-invasively to measure alterations in cerebral blood flow and neural activation in response to external stimuli or cognitive tasks without the use of radionuclides. The ability to monitor these parameters in a safe and repeatable manner with the high spatial and temporal resolution provided by FMRI permits investigators to design a wide variety of experiments to explore brain function.

fMRI methods are based on the observation that changes in local magnetic susceptibility in the brain, within an externally applied magnetic field (as in an MRI scanner), are associated with focal changes in the magnetic resonance parameters of nearby tissue. Changes in magnetic resonance parameters result in time dependent local image intensity variations. Although these susceptibility variations can be detected using conventional MRI techniques, echoplanar MRI is usually preferred for these experiments due to its significantly greater temporal resolution. By recording images at a high rate, small susceptibility changes in vivo can be observed on physiological time scales with a high degree of reliability.

Time-dependent susceptibility changes typically arise from at least two sources. The first is from endogenous changes in blood oxygenation level in response to neural activation, which affects the ratio of diamagnetic and paramagnetic forms of hemoglobin. These susceptibility changes increase image intensity in $T2^*$ weighted pulse sequences by at most 2–5% at 1.5 Tesla (Turner et al., Magn. Reson. Med. 29:277–279, 1993). Several cycles of response to a repeated stimulus can be averaged together to increase the SNR. This limits experiment design significantly, as it is unsuitable for observing transient phenomena or those that change with repeated stimulation.

The second major source of susceptibility contrast arises from the first pass of exogenously applied paramagnetic contrast agents through the cerebral vasculature (Vrillinger et al., Magn. Reson. Med. 6:164–174, 1998; Rosen et al., Magn. Reson. Q. 5:263–281, 1989). Perfusion experiments using contrast agents show image intensity changes of up to 20%. However, they cannot be repeated immediately, so data must be collected in a single pass. The single shot SNR of the echoplanar imaging process is therefore a limiting factor in the magnitude of the effects that can be discerned with fMRI.

One method that has been used to increase the SNR of fMRI has been the use of receive-only radiofrequency (RF) surface coils, which optimize the SNR in a desired region of the brain, while sacrificing image quality in other regions. While this is useful for many types of experiments, it can be difficult to design a single coil with the desired response profile, and experiments that require measurements in multiple separate brain regions cannot benefit from this technique.

In recent years, conventional MRI scanners have been significantly improved through the use of phased-array detectors. (Roemer et al., Magn. Reson. Med. 16:192–225, 1990; Hayes et al., Magn. Reson. Med. 18:30914 319, 1991; Hayes et al., Radiology 189:918–920, 1993). In the MR phased array, signals from multiple independent surface coils are combined to increase both sensitivity and spatial coverage compared to a single coil, while covering large arbitrarily shaped regions. Phased array coils for conventional neuroimaging have demonstrated up to 30% increases in SNR relative to a single surface coil, and 3–4 fold increases in spatial coverage. (Wald et al., Magn. Reson. Med. 34:440–445, 1993). In experiments where a volume head coil would normally be used to cover the entire head, such as perfusion experiments, phased array coils have shown 50–200% increases in sensitivity compared to a quadrature head coil, while still covering most of the cerebrum.

Although a number of conventional scanners are now equipped for use with phased array coils, and many systems are now adding echoplanar capability, current systems have no way to use these capabilities in tandem. Echoplanar imaging places stringent requirements not only on the gradient hardware of an MR system, but also requires a very high bandwidth RF receiver. To date, commercial MR systems have implemented phased array capability by replicating conventional RF receiver chains, and rely on a single, separate, echoplanar receiver for use in high speed imaging.

One proposed engineering solution to the problem of adding additional receiver channels to an echoplanar system is to multiplex analog data from multiple coils in either the time or frequency domain, and use a single RF receiver/digitizer to record the data, leaving the rest of the data acquisition system unmodified (except for processing software). This analog multiplexing option adds few additional parts to the MR system, so the additional hardware may be less expensive. A preliminary report describes a phased array echoplanar system being developed using this technique. (Wu et al., Time Domain Multiplexing Phased Array in EPI. in *5th Scientific Meeting and Exhibition of the International Society for Magnetic Resonance in Medicine.* Vancouver BC, Canada, 1997. In this approach the analog bandwith of the receiver becomes a data bottleneck, and interleaving the multiple data streams into a single analog channel requires a reduction in the image resolution or signal to noise ratio of the individual coils, or both. This can be alleviated through modification of the receiver, but this in turn can cause an SNR penalty when performing single coil studies. Using the same receiver for multiple RF coils can also introduce correlated noise between the individual channels, offsetting one of the major SNR benefits of phased array coils. Further, minimizing the crosstalk between the analog data channels requires that analog multiplexing system remain properly tuned over time. This requires careful design to ensure system stability. Another more subtle problem is that certain multiplexing schemes can introduce time delays between samples taken on different channels. This can lead to ghosting artifacts, requiring special processing to mitigate this effect.

SUMMARY OF THE INVENTION

We have developed a phased array receiver system designed specifically for echoplanar imaging which employs parallel high bandwidth receivers. This system, used in conjunction with phased array coils designed specifically for fMRI, significantly increases the SNR achievable in fMRI experiments, allowing more subtle brain activations to be evaluated.

Thus, the invention provides an echoplanar imaging system for obtaining multiple independent measurements of a magnetic resonance signal from a sample, including: (a) means for stimulating a sample to generate a magnetic resonance signal, (b) two or more receivers adapted to record data corresponding to the magnetic resonance signal, wherein each receiver includes data digitizing means, and (c) a computer for storing the digitized data.

DETAILED DESCRIPTION

Methods

A. Receiver Upgrade

Strategy

The major engineering challenge we faced in building a phased array echoplanar imaging system involved modifying the RF receiver system so that that data can be recorded from multiple RF coils (instead of just one coil) simultaneously, allowing several independent measurements to be made of the magnetic resonance signal arising from a sample. Thus, we used multiple receiver/digitizers, and multiplexed the digital data stream from these receivers as they pass into the host computer which records the data. In other words, we employ parallel receivers, with multiplexing performed in the digital domains. System stability is easily maintained, and each channel operates at its full bandwidth, with no compromise in image quality. The analog channels are completely independent, preserving the full SNR benefit of phased array coils. Each data channel is sampled simultaneously, so no ghosts arise from interleaved sampling. The system data bottleneck is moved to the digital data acquisition bus; the limit on data acquisition becomes the speed of the digital input port on the system host computer.

System Design

Figure 1:
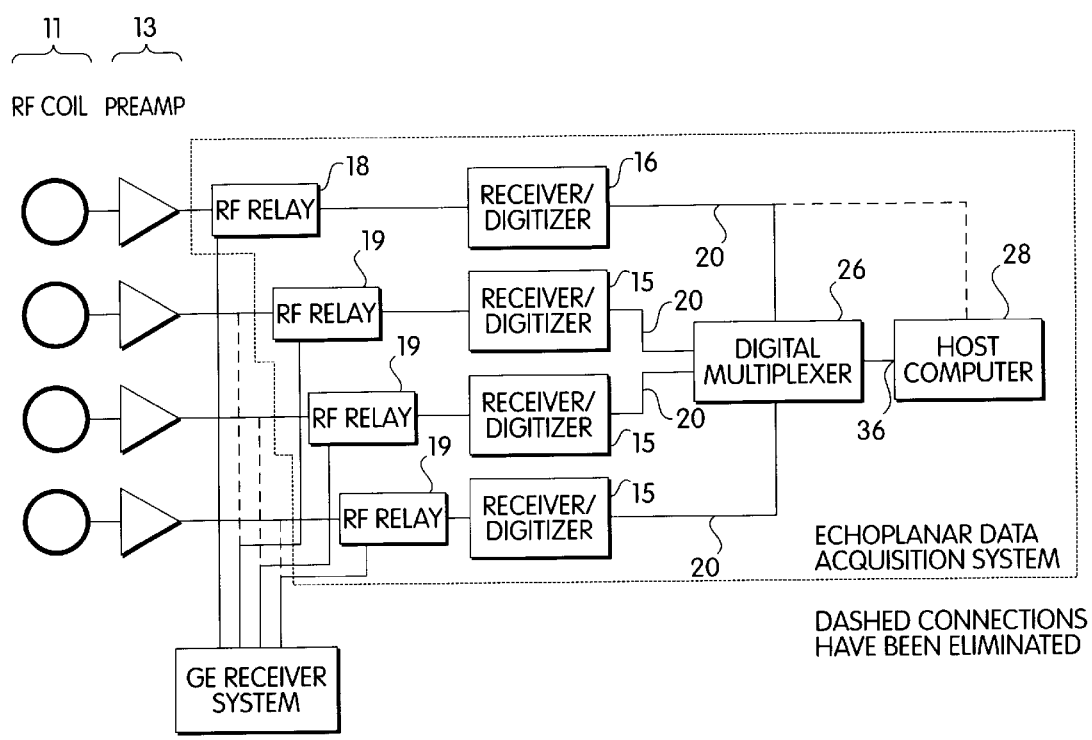
FIG. 1 is a block diagram of a phased array echoplanar fMR imaging system of the invention.

Referring to the block diagram of FIG. 1, a GE Signa 5.4RP system with the multicoil 11, multi-preamp 13 imaging option (General Electric Medical Systems, Milwaukee, Wis.) was provided with an ANMR (Advanced NMR Systems, Wilmington, Mass.) echoplanar gradient upgrade. The ANMR echoplanar system was designed as an add-on upgrade to a conventional General Electric Signa magnetic resonance system. In order to simplify the system integration, the echoplanar system operates completely independently of the Signa system. The only connections between the systems are a synchronization signal derived from the Signa's data bus, a unidirectional control sequence sent from the Signa to the ANMR receiver system, and a TCP/IP connection which allows the transfer of data to and from the Signa. Control of the gradients during echoplanar acquisition is passed to the ANMR system through high current transfer relays, and all RF data is diverted to the ANMR system by the use of RF relays 18, 19. The ANMR receiver system demodulates and digitizes the data, and passes it over a parallel bus 20 to the ANMR host computer system 28 where it is placed into memory to await reconstruction and processing.

By design, this data acquisition process is fully autonomous, and requires no intervention by the ANMR host computer. The phased array system adds three additional ANMR receiver systems 15, operating in parallel to the standard receiver system. These receivers, called RF baseband units, or RFBBs, are separately packaged rack mounted units. The four RFBBs (15, 16) perform the downconversion and sampling of the RF input signal, and output two 16 bit digital data words for each sample. This data stream is processed by a digital multiplexer 26 and passed to the host computer 28.

Digital Multiplexer

The major new component in the phased array data acquisition system is the digital multiplexer (26 in FIG. 1). This device performs two major tasks. The first is to echo all the control and setup signals intended for the primary RFBB to all of the RFBBs. These signals include the sample trigger, local oscillator, and a 10 MHz frequency reference. In order to ensure simultaneous sampling in the four receivers, great care must be taken to ensure that the time delay to each receiver is the same, by using identical buffers and cables of the same length. A serial control line which sets reciever parameters, which is not time critical, is also echoed by the multiplexer.

The second task performed by the multiplexer is to interleave the digital data streams from the separate RFBB's into a single data stream which can be fed to the input port 36 on the ANMR host VME system. When a sample pulse is sent to the RFBBs the multiplexer performs all the handshaking with the receivers, latching the sample data in a buffer when it becomes ready. When the data on all channels is ready, the samples from each receiver are clocked out sequentially to the input port on the VME computer. The data is sent at a rate slightly higher than four times the existing peak sampling rate of 1 complex number per 2.5 us (0.4 MHz). The existing data bus and buffer was sufficiently fast to handle this increased data load without modification. The multiplexer can be set to use one, two, or four receivers by front panel switches. In single receiver mode, the multiplexer acts transparently, and operation is identical to the standard system.

The digital multiplexer is built into a 12 inch high, 19 inch rack mount case (not shown). The multiplexer and the three additional receivers are housed in a 7 foot tall, 19 inch rack mount cabinet in the Signa equipment room. The only additional hardware in the system is the four channel RF transfer switch to divert the multicoil data from the GE receiver system to the four RFBBs. This replaces the single channel switch already in the system.

Software

Modifications to the host computer software to accept the additional data are minimal. An extra variable can be added to the header file generated by standard pulse sequences to specify the number of coils and increase the data buffer size accordingly, or the number of coils can be specified manually on the host computer at acquisition time.

Reconstruction is straightforward; first, the interleaved raw data is separated by receiver and the images from the individual receivers are reconstructed independently. The single coil images are then combined in a way that optimizes the SNR of the resultant image. This important step is easily performed on the magnitude images by using the 'sum of squares' method (1). If p(i,n) denotes the $n^{th}$ pixel from receiver i, the $n^{th}$ pixel in the combined image, $P_c(n)$, is simply:

$$p_c(n) = \sqrt{\sum_i [p(i,n)]^2}$$

Reconstruction is performed offline, or it can be performed on the scanner to provide immediate feedback to the experimenter.

RF Coil

In order to fully exploit the power of the phased array receiver system for functional imaging, phased array coils are preferably used which are optimized for the type of functional experiment being performed. Two such arrays which we have evaluated are described below. The phased array coil configurations described are based on designs previously tested for high resolution neuro-imaging. (Wald et al. Reson. Med, 34:433–439, 1995; Wald et al., Magn. Reson. Med. 34:433–439, 1995). These coils are constructed by etching flexible circuit board (Pyrolux$^R$, Dupont, Wilmington, Del.) to improve durability and reproducibility and are contoured to the shape of the head.

Visual Cortex/Temporal Lobe Array

Activation experiments can benefit significantly from phased array functional imaging. A commonly used experimental paradigm in functional imaging are photic stimulation, where neural activation is measured in the calcerine fissure in response to stimulation with light (Ogawa et al., Proc. Natl. Acad. Sci. USA 89:5675–5679, 1990). The relatively small signal change resulting from neural activation makes optimization of the SNR critical for fMRI experiments, and has led to the widespread use of surface coils for these experiments. However the non-uniform spatial profiles of surface coils has meant that this additional SNR has come at the expense of spatial coverage, so that correlated activity in different brain regions may go undetected. Phased array coils with sensitivity profiles tailored to the expected areas of activation allow expanded spatial coverage without sacrificing the SNR benefit of surface coils.

Figure 2A:
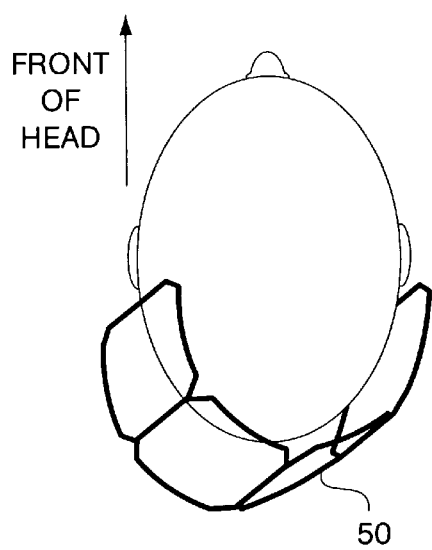
FIG. 2a is a schematic diagram of a design for one type of visual/temporal four-coil horizontal array of the invention.

FIG. 2a shows a design for one type of visual/temporal array 50, a four coil horizontal array which covers the region of activation typically seen in photic experiments, while also detecting the signal from the middle temporal lobe with high efficiency. Signal to noise comparisons performed using conventional imaging techniques show that in the region where photic activation is typically observed the average SNR increase is 7%. The increase in the temporal lobe is more dramatic—180%. Because the receiver design described above keeps the signals completely independent until after digitization, the SNR gain in the phased array echoplanar system is expected to be identical to that in the phased array conventional system.

Bilateral Temporal Lobe Array

Figure 2B:
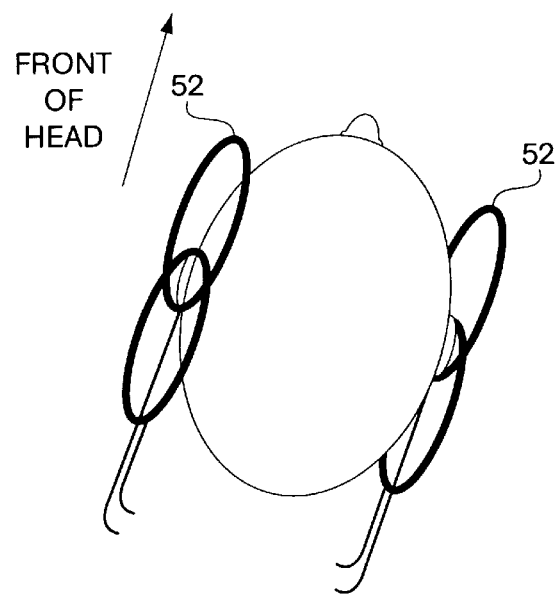
FIG. 2b is a schematic diagram of a coil employed in a bilateral temporal lobe array system of the invention.

Another use of functional imaging is brain perfusion mapping with dynamic susceptibility contrast (DSC) imaging (Belliveau et al., Magn. Reson. Med. 14:538–546, 1990; Harris et al., Am. J. Psychiatr. 153:721–724, 1996). For this type of experiment, good coverage of a large fraction of the cortex is necessary (depending on the brain area of interest). To demonstrate this, we have used a bilateral temporal lobe array 52 optimized for coverage of the temporal and frontal cortices, the regions shown to have the largest perfusion defects in Alzheimer's Disease. The coil is shown schematically in FIG. 2b. The SNR in the frontal and temporal cortical regions (the region of interest for DSC mapping) measured using conventional images is increased with the phased array coil by ~100% relative to the quadrature head coil.

In vivo Tests

Two experiments were performed using the echoplanar phased array system in order to demonstrate the SNR increase of the system relative to single coil fMRI.

Photic Stimulation

In order to evaluate the effect of the phased array on the detection of activation in a BOLD experiment, a photic stimulation experiment was performed. The subject was a healthy 35 year old female volunteer. Bilateral visual stimulation was provided by LED goggles (GRASS Instrument Company, Quincy Mass.) flashing at 8 Hz. Thirty seconds of stimulation were alternated with 30 seconds of rest, while echoplanar gradient echo images were recorded (flip angle= 66°, TR=2 s, TE=40 ms, 128×64 pixels in a 40 cm×20 cm FOV, slice thickness=7 mm with no gap between slices, obtained obliquely parallel to the calcerine fissure). The experiment was performed twice; first with a General Electric 5" general purpose surface coil placed over the visual cortex, and subsequently with the 4 coil visual/temporal array centered on the same position. Care was taken to position the patient identically between the two exams, and the slices were relocalized when the coils were changed.

After each experiment, the data sets were motion corrected using the DART registration algorithm (Maas et al., Magn. Reson. Med. 37:131–139, 1997). Activation maps were then calculated for each image series by cross correlating the time history of the image intensity value at each pixel in the image with a reference waveform, as described by Bandettini et al., (Magn. Res. Med. 20:161–173, 1993).

CBV Mapping

Figure 3A:
FIGS. 3a and 3b are a pair of surface coil images, one conventional and one generated according to the invention.
Figure 3B:
Figure 4A:
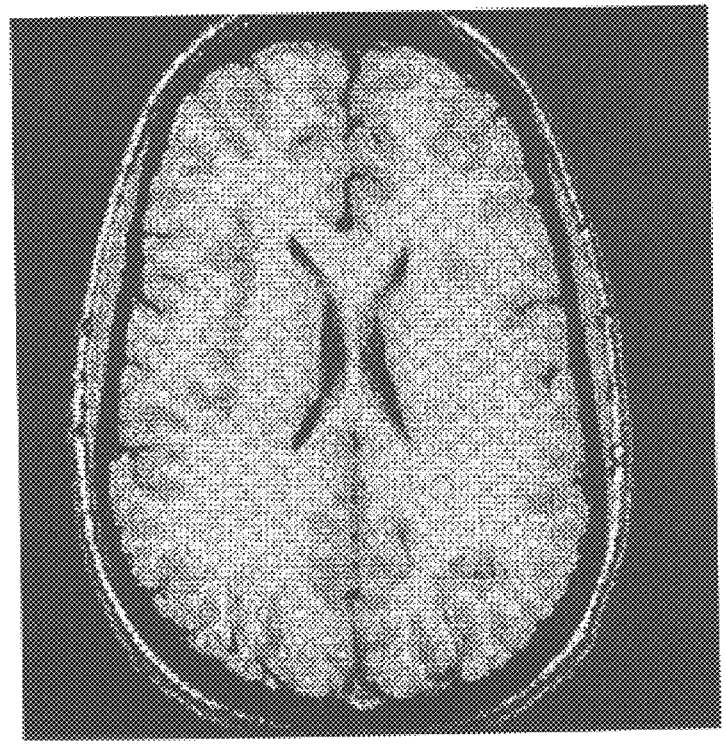
FIGS. 4a and 4b are a pair of bilateral temporal lobe array images, one conventional and one generated according to the invention.
Figure 4B:
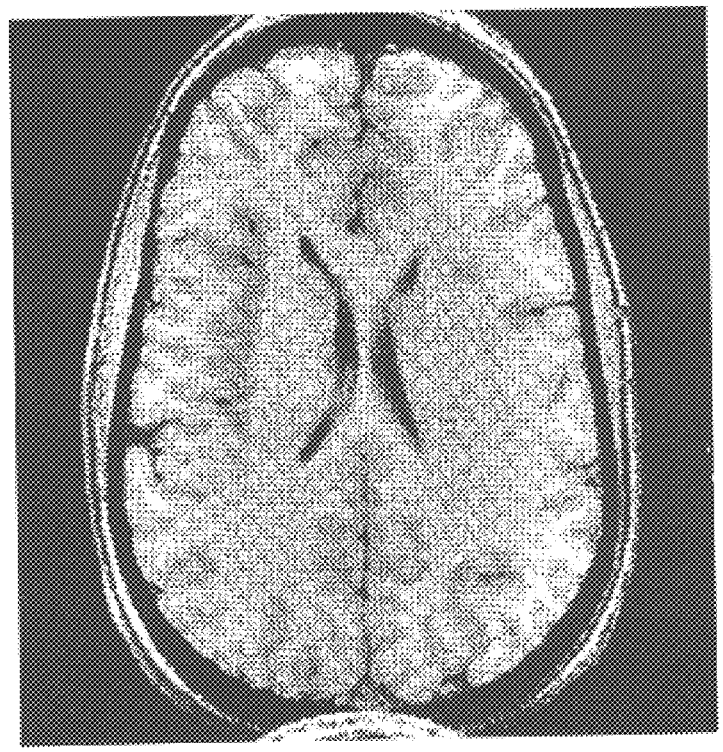
Figure 5A:
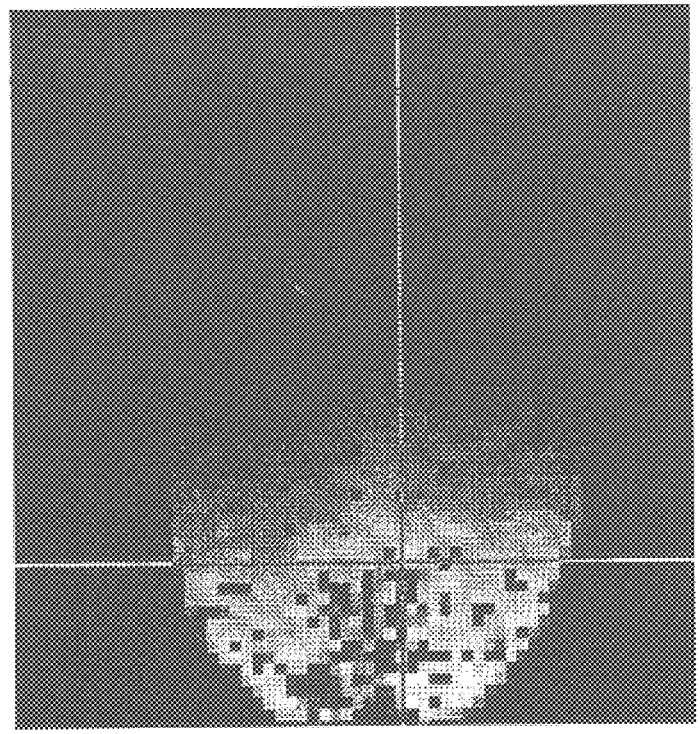
FIGS. 5a and 5b are a pair of calculated photic activation maps, one conventional and one generated according to the invention.
Figure 5B:
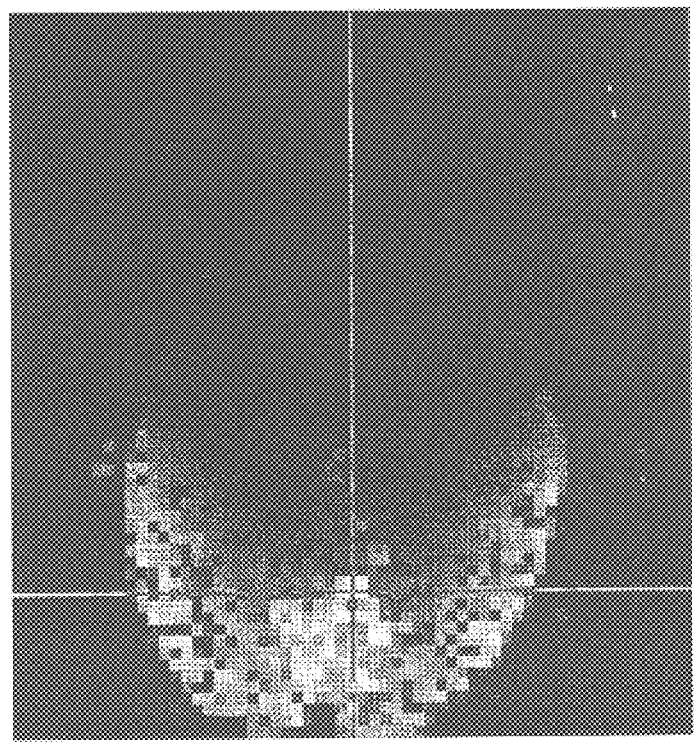
Figure 6A:
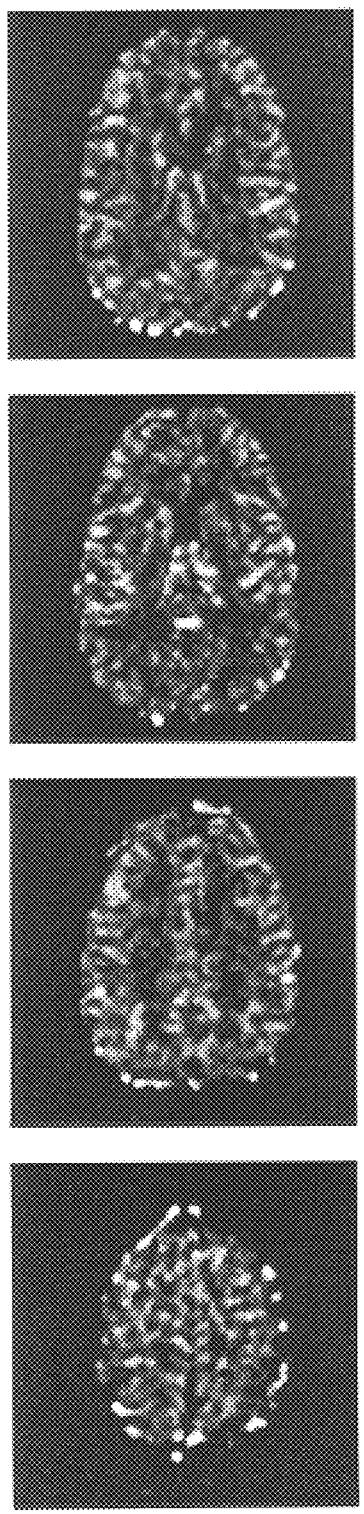
FIGS. 6a and 6b compare the calculated CBV maps generated from the data sets obtained with the quadrature head coil and the bilateral temporal array coil.
Figure 6B:
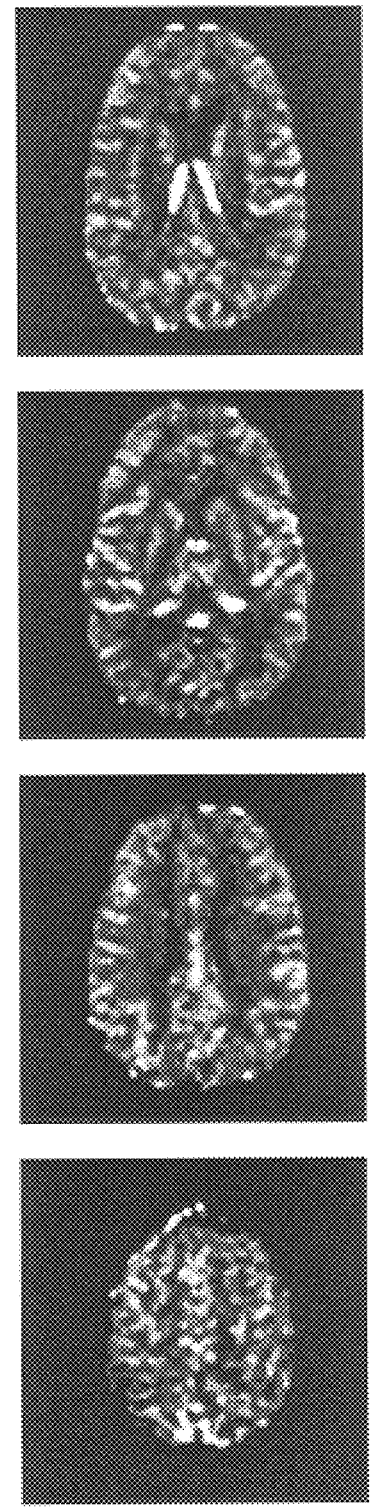

A comparison was also performed on a CBV mapping experiment. Two CBV maps were made of a 37 year old healthy male volunteer. The first data set was obtained using the standard GE quadrature head coil. The coil was then replaced with the bilateral temporal lobe array described above. In each case, a series of 50 images of 10 slices were recorded (spin echo, TR=2s, TE=100 ms, 128×64 pixels over a 40 cm×20 cm FOV, slice thickness=7 mm with a 3 mm gap between slices). Twenty seconds into each scan (after 10 reference images) a bolus of 0.10 mEq/kg of ProHance was injected into an IV line in the antecubital vein. CBV images were calculated from the data sets by the dynamic susceptibility contrast method described by Belliveau, et al. supra. The CBV maps are compared in FIGS. 6a and 6b. The image quality is clearly higher in the frontal and temporal regions of the phased array images. Image quality is even in the center of the head. This is consistent with the superior signal to noise ratio of the bilateral temporal array previously demonstrated for conventional images Results and Discussion Calculated photic activation maps are shown in FIGS. 3a and 3b. These image data sets have been processed identically; the colored pixels represent activated pixels in the brain, with the color indicating the statistical significance and the sign of the correlation of the detected activation. The image on the right, taken with the phased array, detects activation with significantly higher statistical significance than the surface coil image throughout the visual cortex. In addition, this image shows activation in the visual association area which is not detected with the surface coil, due to the enhanced coverage of the temporal lobe area due to this coil. One interesting feature to note is that there are regions of detected activation in the temporal lobe areas which are negatively correlated with the activity detected in the visual cortex. Whether this is due to neuronal inhibition or due to blood flow diversion from these areas to the visual cortex is not discernable from these images; however, this phenomenon is clearly not detected using the standard surface coil method, and hints at the new types of phenomena which can be explored using this system.

The single shot signal to noise ratio of echoplanar imaging is one of the fundamental limits to most functional imaging techniques. While the use of dedicated surface coils has provided great advantages for certain types of experiments, the more general problem of improving the SNR of echoplanar imaging over large regions requires the use of phased array coils, high field scanners, or both.

We have demonstrated that a standard clinical echoplanar system can be modified quite economically to take full advantage of the benefits of phased array imaging. The phased array coils can be used to increase the SNR in a single region over conventional surface coils, increase the coverage area, or a combination of the two. In addition to increasing the quality of functional image data sets, phased array coils facilitate new types of experiments which detect patterns of functional response over large spatial areas. While we have focused on functional imaging in the brain in this study, this system could have great benefits for echoplanar studies of other organs, such as the heart. All references cited herein are hereby incorporated by reference.

What is claimed is:

1. A method for obtaining multiple independent measurements of a functional magnetic resonance signal from a sample, said method comprising subjecting said sample to functional magnetic resonance imaging using an echoplanar imaging system comprising
   (a) at least two RF coils to receive said functional magnetic resonance signal of said sample;
   (b) at least two preamps to amplify said signal;
   (c) at least two receivers to receive and digitize data corresponding to said signal from said sample; and
   (d) a computer for storing said digitized data.

2. The method of claim 1, further comprising (e) a digital multiplexer to interleave said data into a single data stream which can be fed to the computer.

* * * * *